United States Patent [19]

Hsia et al.

[11] Patent Number: 5,701,013
[45] Date of Patent: Dec. 23, 1997

[54] WAFER METROLOGY PATTERN INTEGRATING BOTH OVERLAY AND CRITICAL DIMENSION FEATURES FOR SEM OR AFM MEASUREMENTS

[75] Inventors: Liang-Choo Hsia, Taipei; Thomas Chang, Hsin-Chu, both of Taiwan

[73] Assignee: Mosel Viltelic, Inc., Taipei, Taiwan

[21] Appl. No.: 660,486

[22] Filed: Jun. 7, 1996

[51] Int. Cl.$^6$ .................................. H01J 37/304
[52] U.S. Cl. ........................ 250/491.1; 257/797
[58] Field of Search ............... 250/491.1; 257/797

[56] References Cited

U.S. PATENT DOCUMENTS

| | | | |
|---|---|---|---|
| 5,180,150 | 1/1993 | Prusak et al. | 269/254 |
| 5,208,648 | 5/1993 | Batchelder et al. | 356/237 |
| 5,220,403 | 6/1993 | Batchelder et al. | 356/345 |
| 5,298,975 | 3/1994 | Khoury et al. | 356/375 |
| 5,352,249 | 10/1994 | Vollaro | 29/25.01 |
| 5,365,072 | 11/1994 | Turner et al. | 250/491.1 |
| 5,474,647 | 12/1995 | Poultney et al. | 156/626.1 |

OTHER PUBLICATIONS

L.C. Hsia, L. S. Su–"Estimating Orthogonality Deviation of a Step–and–Repeat Lithographic System" Solid State Technology pp. 155–160 May 1983.

Sunny Stalnaker, Ricky A. Jackson & Faris Modawar–A reprint from the Proceedings of KTI Interface '90 Microlithography Seminar "Automated Misregistration Metrology for Advanced Devices Manufacturing" pp. 137–146 Nov. 8–9–1990.

*Primary Examiner*—Jack I. Berman
*Attorney, Agent, or Firm*—Barnes, Kisselle, Raisch, Choate, Whittemore & Hulbert P.C.

[57] ABSTRACT

The present invention provides a wafer metrology pattern integrating both overlay and critical dimension features for SEM or AFM measurements. The present invention provides an improved test mask target which contains lines measuring 0.25 μm, 0.3 μm, and 0.5 μm. The spaces between the lines can be adjusted accordingly. The improved test mask target provides a pattern that combines the wafer critical dimension and box-in-box overlay targets into a single structure. As a result, the pattern may be used for both overlay and critical dimension verifications in a single AMF or SEM measurement. More precisely, wafer overlay and critical dimension disposition may be made simultaneously, reducing the need to perform multiple measurements at each testing step.

18 Claims, 1 Drawing Sheet

5,701,013

WAFER METROLOGY PATTERN INTEGRATING BOTH OVERLAY AND CRITICAL DIMENSION FEATURES FOR SEM OR AFM MEASUREMENTS

FIELD OF THE INVENTION

The present invention generally relates to overlay and critical dimension measurements and, more particularly, to a wafer metrology pattern integrating both overlay and critical dimension features for measurement of the variation of orthogonal errors in a step-and-repeat lithographic system.

BACKGROUND OF THE INVENTION

It is desirable to produce memory devices using large scale integration (LSI) or very large scale integration (VLSI) to fabricate extremely complex electrical circuits on a single chip of silicon. The reduction of the size of memory cell dimensions has ignited a revolution in the design and manufacture of countless semiconductor devices. A photolithography step is frequently utilized which is a process by which a microscopic pattern is transferred from a photomask to the silicon wafer surface of an integrated circuit. A typical photolithographic system uses a step-and-repeat process to gradually transfer the masking pattern from a macroscopic prototype to a microscopic, or chip level, implementation. The process involves many iterations of individual reductions. Each individual reduction may introduce errors into the final mask. Conventional means of monitoring and correcting such inherent errors fail to provide the needed resolution and measurement accuracy when implemented with extremely small chip designs.

To meet the objective of increasing the density of memory cells or components on a chip, semiconductor processing engineers continue to refine wafer processing methodologies. Of particular importance is the patterning techniques through which individual regions of the semiconductor structure are defined. In an effort to increase the number of components in the semiconductor structure, integrated circuit configurations have evolved into complex three dimensional topographies comprised of the wafer material itself in an overlay.

As device and memory cell dimensions continue to shrink, the requirement for overlay measurement accuracy to compensate processing inaccuracies previously described continues to increase. Conventional optical overlay measurement tools cannot provide the needed resolution and measurement accuracy for the continually reducing memory cell dimensions. For example, for a 0.25 µm design rule, the overlay specification will be in the range of 0.025 µm. As a result, overlay measurements have to utilize AFM (Atomic Force Microscopy) or SEM (Scanning Electron Microscopy) metrology techniques in order to verify measurement accuracy.

Using conventional techniques, conventional wafer product overlay measurements employ test mask targets (e.g., box-in-box and critical dimension (CD)) in different areas of the silicon wafer. These test mask targets are often laid out in the peripheral regions of the chip. These measurements are needed to verify the accuracy of the wafer components by comparing shifts in the box centerlines to a process average. With conventional techniques, wafer dimensional quality disposition or diagnostics cannot be made until both the box-in-box and the critical dimension targets are taken on an appropriate number of cells within the memory array. Since this process requires two separate measurement steps, as well as a comparison between the measurements, the procedure is cumbersome. The diagnostic process is exaggerated with the increased density of memory cell arrays and tends to seriously hamper the implementation of a totally automated fabrication and manufacturing process.

Referring to FIG. 1, a conventional box-in-box pattern 10 is shown. The box-in-box pattern 10 comprises an overlay 12 and an overlay 14. The overlay 12 has a width of 3.0 µm (e.g., w=3.0 µm). Similarly, the overlay 14 has a 3.0 µm width. As a result of the limitations of measurement devices, the box-in-box pattern 10 cannot be used for critical dimension disposition requiring 0.5 µm, 0.3 µm, or 0.25 µm lines, which are generally required for higher density, new generation, VLSI devices.

It is therefore an object of the present invention to provide a wafer metrology pattern that permits a large portion of a silicon wafer scribe line area to be sampled for critical dimension size variation analysis with no increase in inspection time.

It is another object of the present invention to provide a wafer metrology pattern that permits high measurement accuracy and efficiency that is more conducive to an automated production facility.

It is a further object of the present invention to provide a wafer metrology pattern that improves the quality and efficiency of wafer product disposition in a semiconductor manufacturing process.

It is still another object of the present invention to provide a wafer metrology pattern that combines both the wafer critical dimension and the box-in-box overlay targets into a single structure, reducing the need to perform multiple measurements at each testing step.

It is yet another object of the present invention to provide a wafer metrology pattern to be used for both overlay and critical dimension verifications in a single AMF or SEM measurement step where the overlay and critical dimension disposition may be made simultaneously.

SUMMARY OF THE INVENTION

The present invention provides a wafer metrology pattern integrating both overlay and critical dimension features for SEM or AFM measurements. The present invention provides an improved test mask target which may contain lines measuring 0.25 µm, 0.3 µm and 0.5 µm. The spaces between the lines can be adjusted accordingly. The improved test mask target provides a pattern that combines the wafer critical dimension and box-in-box overlay targets into a single structure. As a result, the pattern may be used for both overlay and critical dimension verifications in a single AMF or SEM measurement. More precisely, wafer overlay and critical dimension disposition may be made simultaneously, reducing the need to perform multiple measurements at each testing step.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1:
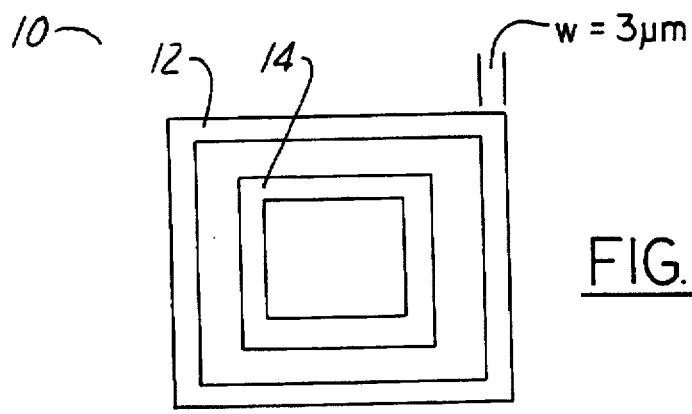
FIG. 1 is a conceptual diagram of a prior art box-in-box wafer metrology pattern.
Figure 2:
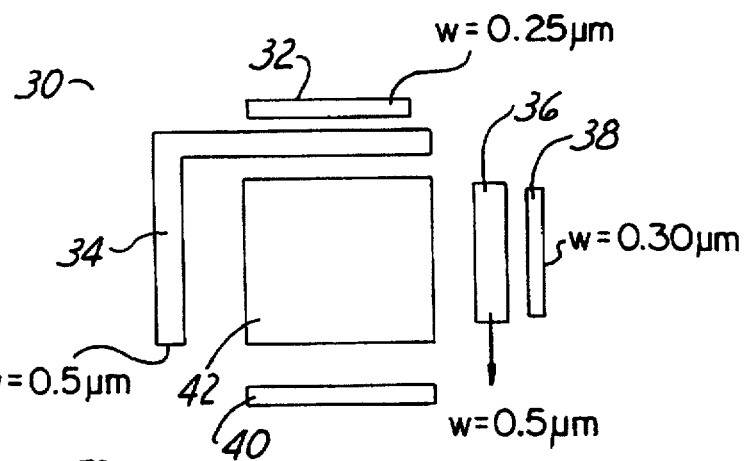
FIG. 2 is a conceptual diagram of a wafer metrology pattern of the presently preferred embodiment of the invention.

Referring to FIG. 2, a conceptual diagram of a new wafer metrology test mask target pattern 30 is shown in accordance with a presently preferred embodiment of the invention. The wafer metrology pattern 30 combines both overlay and critical dimension features. The wafer metrology pattern 30 generally comprises a first section 32, a second section 34, a third section 36, a fourth section 38, a fifth section 40 and a sixth section 42. The first section 32 comprises a line having a width measuring 0.25 µm or a width sufficient to provide adequate space for the critical dimension analysis. The second section 34 is a generally L-shaped section that comprises a line having a width of 0.5 µm or a width sufficient to provide adequate space for the critical dimension analysis. The third section 36 is a line having a width of approximately 0.5 µm or a width sufficient to provide adequate space for the critical dimension analysis. The fourth section 38 is a line having a width of 0.30 µm or a width sufficient to provide adequate space for the critical dimension analysis. The fifth section 40 is a line having a width of 0.25 µm or a width sufficient to provide adequate space for the critical dimension analysis. The sixth section 42 is an overlay section that provides an orientation basis for the wafer metrology pattern 30 to be oriented. The second section 34, the third section 36 and the fourth section 40 are positioned in a generally concentric fashion about the sixth section 42. The first section 32 and the fourth section 38 are compensating lines positioned radially about the second section 34 and the third section 36. It should be noted that additional compensating lines may be implemented according to the design criteria of a particular application. It should also be noted that the widths indicated for the first section 32, the second section 34, the third section 36, the fourth section 38 and the fifth section are given for illustrative purposes only. Other widths may be used to fit the design criteria of a particular application.

Dimensions can be measured with a metrology tool which utilizes the atomic force microprobe (AFM). The AFM can measure trench depth and width of the sections 32–42. One such system incorporates a two-dimensional length measurement system, such as a two-axis laser interferometer, in addition to a two-dimensional laser heterodyne system which detects the change in resonance of the vibrating probe tip as it approaches the surface. The probe tip may be vibrated in either the horizontal or vertical direction depending upon which surface (e.g., trench wall or bottom) is being approached. The mean position of the probe tip is held stationary while the wafer or other part being measured is moved parallel or perpendicular to its surface and the displacement is measured.

It should be noted that since E-beam systems are used for mask making, control of the line width is known to be asymmetric about a nominal center line position. The capability of performing overlay analysis on narrower lines is a major benefit since the degree of asymmetry is a percentage of the line width. As the width of the lines decreases, the apparent placement error also decreases, which produces an improvement in the wafer's apparent overlay. The wafer metrology pattern 30 takes advantage of these reduced degree percentage of line width errors for the narrower lines. The spaces between the first section 32, the second section 34, the third section 36, the fourth section 38, the fifth section 40 and the sixth section 42 can be adjusted according to the design criteria of a particular application. Additionally, the new wafer metrology pattern 30 permits a larger portion of wafer scribe line area to be sampled for critical dimension size variation analysis. This causes no increase in inspection time and is useful when diagnosing problems involving the materials used, the processing steps or the hardware.

Figure 3:
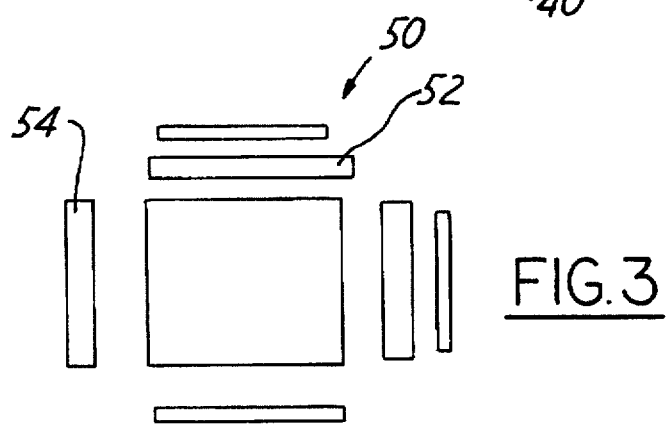
FIG. 3 is a conceptual diagram of a wafer metrology pattern of a first alternate embodiment of the invention.
Figure 4:
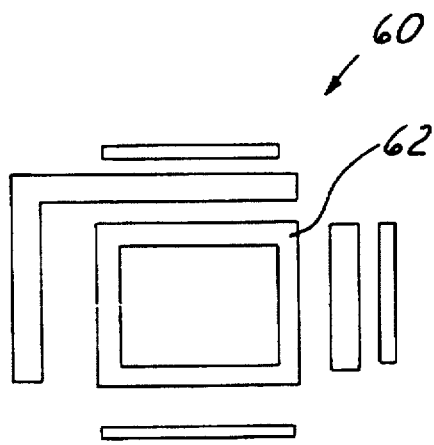
FIG. 4 is a conceptual diagram of a wafer metrology pattern of a second alternate embodiment of the invention.

FIG. 3 and FIG. 4 show two alternate embodiments of the present invention. FIG. 3 shows a conceptual diagram of a wafer metrology test mask target pattern 50 in accordance with a first alternate embodiment of the present invention. In this embodiment, the L-shaped section 34 shown in FIG. 2 is replaced by two rectangular sections 52 and 54. FIG. 4 shows a conceptual diagram of a wafer metrology test mask target pattern 60 in accordance with a second alternate embodiment of the present invention. In this alternate embodiment, the overlay section 42 shown in FIG. 2 is replaced a rectangular frame section 62.

While the invention has been particularly shown and described with reference to a preferred and two alternate embodiments thereof, it will be understood by those skilled in the art that various changes in form and details may be made without departing from the spirit and scope of the invention.

We claim:

1. A wafer metrology pattern for use in a critical dimension analysis of a semiconductor device configuration comprising:

a first central section for providing a central reference point;

a plurality of sections positioned concentrically around said central section including a plurality of spaces between each of said plurality of sections; and a plurality of compensating lines positioned radially about at least two particular plurality of said sections to compensate for said plurality of spaces.

2. The wafer metrology pattern according to claim 1 wherein one of said plurality of sections is generally L-shaped.

3. The wafer metrology pattern according to claim 1 wherein one of said plurality of section is generally rectangularly shaped.

4. The wafer metrology pattern according to claim 1 wherein two of said plurality of sections are generally rectangularly shaped each having a fixed width.

5. The wafer metrology pattern according to claim 1 wherein two of said plurality of sections are rectangular shaped each having a fixed width and one of said plurality of sections is generally L-shaped having a fixed width.

6. The wafer metrology pattern according to claim 5 wherein said fixed width of said plurality of sections and said fixed width of said L shaped pattern are equal.

7. The wafer metrology pattern according to claim 1 wherein said plurality of compensating lines are rectangular shaped each having a fixed width.

8. The wafer metrology pattern according to claim 7 wherein said fixed width of said plurality of compensating lines is less than said fixed width of said plurality of sections.

9. The wafer metrology pattern according to claim 7 wherein said fixed width of said plurality of compensating lines is less than ½ of said fixed width of said plurality of sections.

10. The wafer metrology pattern according to claim 5 wherein said fixed width of said rectangular shape is sufficient to provide adequate space for said critical dimension analysis.

11. The wafer metrology pattern according to claim 7 wherein said fixed width of one of said compensating lines is sufficient to provide adequate space for said critical dimension analysis.

12. The wafer metrology pattern according to claim 7 wherein said fixed width of another one of said compensating lines is sufficient to provide adequate space for said critical dimension analysis.

13. A wafer metrology pattern for use in critical dimension analysis of high density memory cell configuration comprising:

a first central section for providing a central reference point;

a first section positioned concentrically around said central section, said first section being generally L-shaped;

a second section positioned concentrically around said central section, said second section being generally rectangularly shaped;

a third section positioned concentrically around said central section, said third section being generally rectangularly shaped; and a plurality of compensating lines positioned radially about at least two of said first section, said second section and said third section.

14. The wafer metrology pattern according to claim 13 wherein said first section has a fixed width of said L-shape is sufficient to provide adequate space for said critical dimension analysis.

15. The wafer metrology pattern according to claim 13 wherein said second and third sections have a fixed width of said rectangular shape is sufficient to provide adequate space for said critical dimension analysis.

16. The wafer metrology pattern according to claim 13 wherein one of said plurality of compensating lines has a fixed width of said rectangular shape is sufficient to provide adequate space for said critical dimension analysis.

17. The wafer metrology pattern according to claim 12 wherein one of said plurality of compensating lines has a fixed width of said rectangular shape is sufficient to provide adequate space for said critical dimension analysis.

18. A wafer metrology pattern for use in critical dimension analysis of high density memory cell configuration that combines overlay and critical dimension features comprising:

a first central section for providing a central reference point;

a first section positioned concentrically around said central section, said first section being generally L-shaped having a fixed width of said rectangular shape is sufficient to provide adequate space for said critical dimension analysis;

a second section positioned concentrically around said central section, said second section being generally rectangularly shaped having a fixed width of said rectangular shape is sufficient to provide adequate space for said critical dimension analysis;

a third section positioned concentrically around said central section, said third section being generally rectangularly shaped having a fixed width of said rectangular shape is sufficient to provide adequate space for said critical dimension analysis; and a plurality of compensating lines positioned radially about at least two of said first section, said second section and said third section, one of said plurality of compensating lines having a fixed width of said rectangular shape is sufficient to provide adequate space for said critical dimension analysis and another of said plurality of compensating lines having a fixed width of said rectangular shape is sufficient to provide adequate space for said critical dimension analysis.

* * * * *